United States Patent
Chen et al.

(10) Patent No.: US 11,381,765 B2
(45) Date of Patent: Jul. 5, 2022

(54) CMOS IMAGE SENSOR WITH PIXEL POWER SUPPLY NOISE SUPPRESSION CIRCUIT

(71) Applicant: SmartSens Technology (HK) Co., Ltd, Kowloon (HK)

(72) Inventors: Peng Chen, Shanghai (CN); Yue Li, Shanghai (CN); Jinjian Hou, Shanghai (CN); Guanjing Ren, Shanghai (CN); Yaowu Mo, Shanghai (CN)

(73) Assignee: SmartSens Technology (HK) Co. Ltd., Kowloon (HK)

( * ) Notice: Subject to any disclaimer, the term of this patent is extended or adjusted under 35 U.S.C. 154(b) by 91 days.

(21) Appl. No.: 17/087,905

(22) Filed: Nov. 3, 2020

(65) Prior Publication Data
US 2022/0014693 A1   Jan. 13, 2022

(30) Foreign Application Priority Data

Jul. 10, 2020  (CN) .......................... 202010664295.8

(51) Int. Cl.
| *H04N 5/357* | (2011.01) |
| *H01L 27/146* | (2006.01) |
| *H04N 5/355* | (2011.01) |
| *H04N 5/3745* | (2011.01) |
| *H04N 5/369* | (2011.01) |

(52) U.S. Cl.
CPC ....... *H04N 5/357* (2013.01); *H01L 27/14603* (2013.01); *H01L 27/14612* (2013.01); *H01L 27/14636* (2013.01); *H04N 5/3559* (2013.01); *H04N 5/3698* (2013.01); *H04N 5/37457* (2013.01)

(58) Field of Classification Search
CPC ................ H04N 5/357; H04N 5/37457; H01L 27/14603; H01L 27/14612; H01L 27/14636
See application file for complete search history.

(56) References Cited

U.S. PATENT DOCUMENTS 7,626,622 B2 * 12/2009 Kasuga .................. H04N 5/357
                                                        348/241
8,773,580 B2 *  7/2014 Ebihara ................ H04N 5/3741
                                                        348/241
2015/0288902 A1  10/2015 Sun et al.

* cited by examiner

*Primary Examiner* — Ahmed A Berhan
(74) *Attorney, Agent, or Firm* — Eric Karich; Karich & Associates

(57) ABSTRACT

An image sensor pixel noise suppression circuit having a source follower transistor based pixel circuit, a power supply voltage and noise mirror circuit, a power supply voltage and noise gain circuit, and a comparator circuit. An output of the comparator circuit provides an image related output signal wherein the noise component of the source follower signal has been suppressed. The invention further includes a CMOS image sensor containing the image sensor pixel noise suppression circuit.

11 Claims, 3 Drawing Sheets

CMOS IMAGE SENSOR WITH PIXEL POWER SUPPLY NOISE SUPPRESSION CIRCUIT

BACKGROUND OF THE INVENTION

Field of the Invention

This invention relates generally to image sensors, and more particularly to CMOS image sensors. The present invention provides an image sensor array and circuit design employing a power supply noise suppression circuit. An image sensor comprising the invented circuit design may be incorporated within a digital camera.

Description of Related Art

An image capture device includes an image sensor and an imaging lens. The imaging lens focuses light onto the image sensor to form an image, and the image sensor converts the light into electrical signals. The electric signals are output from the image capture device to other components of a host electronic system. The image capture device and the other components of a host electronic system form an imaging system. Image sensors have become ubiquitous and may be found in a variety of electronic systems, for example a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has led to pixel arrays becoming much larger in the number of pixels, but not much larger in overall area due to the use of narrower interconnect lines and smaller electronic components in the pixels and in the readout and control circuits. Miniaturization has also come with the loss of pixel photosensitivity and dynamic range which require new approaches in order to mitigate. Pixel power supply noise may contribute more significantly to signal loss as pixels are miniaturized. New approaches to image sensor circuit design in order to reduce the effects of pixel power supply noise are required to further enable the employment of large imaging arrays.

The present invention fulfills these needs and provides further advantages as described in the following summary.

SUMMARY OF THE INVENTION

The present invention teaches certain benefits in construction and use which give rise to the objectives described below.

In a CMOS image sensor, a pixel array is composed of several pixel units, the pixel unit often adopting a 3 T, 4 T or 5 T structure. The 4 T, for example, consists of a transfer transistor, a reset transistor, a source follower transistor, and a row select transistor. The pixel unit uses photodiodes to perform photoelectric conversion to form photo-generated carriers and generate analog signals. By gating and reading the rows of the pixel array, the analog signals of each column are read out with subsequent operational gain amplification, analog-to-digital conversion, etc. comprising the signal processing process.

In practice the noise of the power supply of the Source Follower (SF) transistor of the pixel circuit is capacitively coupled to the Floating Diffusion (FD) node of the pixel unit, and then the signal including the noise will be amplified through the source follower transistor. The noise is reflected in the output data after conversion, which affects the signal-to-noise ratio of the image. The current art processing method comprises separately setting an LDO (Low Dropout Regulator or low dropout linear regulator) for the pixel circuit to reduce the impact of external power supply noise on image quality. If the output of the LDO includes a noise component, the power supply noise will still be reflected in the image. Therefore, when the LDO is used to solve the power supply noise, when the chip interference is large, the stability speed of this method is limited. In the process of its stabilization, the power supply noise is still present and it will be reflected in the image. Additional disadvantages associated with the use of the LDO is that the LDO occupies a large layout area, consumes power and limits the power supply voltage available to other modules, which may cause the performance of the image sensor chip to decrease. Ultimately use of an LDO supply for the floating drain decreases the maximum amplitude of its working range.

In view of this, the present invention provides a power supply noise suppression circuit and suppression method which can effectively suppress the power supply noise interference of the source follower transistor of the image sensor, reduce image noise and improve image quality.

The present invention inputs the image signal superimposed with the first power supply noise signal of the power supply in the pixel circuit to the first input terminal of a comparator by setting the pixel circuit, the mirror power supply noise circuit and the comparator, and superimposes the mirror power supply noise circuit. The comparison signal of the second power supply noise signal of the power supply is input to the second input terminal of the comparator, and the second power supply noise signal has the same amplitude as the first power supply noise signal. The mirror power supply noise circuit includes a mirror circuit and a gain amplifier circuit. The mirror circuit is used to convert the noise voltage of the power supply into a compensation current, and the gain amplifier circuit is used to convert the compensation current into a voltage and perform gain amplification to output the second power supply noise signal to the second input of the comparator. Therefore, the present invention uses the power supply noise of the power supply in the mirror power supply noise circuit to suppress the power supply noise of the source follower transistor in the pixel circuit, which can effectively resist power supply noise interference, reduce image noise and improve image quality.

A primary objective of the present invention is to provide an image sensor pixel power supply noise suppression circuit which has advantages not taught by the prior art.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, an image sensor pixel power supply noise suppression circuit and method.

Various embodiments of the image sensor pixel power supply noise suppression circuit and method are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc.

In other instances, well-known structures, materials, or operations are not shown or described in detail to avoid obscuring certain aspects.

Throughout the specification and claims, the following terms take the meanings explicitly associated herein, unless the context clearly dictates otherwise. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). The term "circuit" means either a single component or a multiplicity of components, either active or passive, that are coupled together to provide a desired function. The term "signal" means at least one current, voltage, or data signal. Should the invention involve a stacked chip arrangement, the front sides of two chips may be directly connected since the electrical interconnects on each chip will most commonly be formed on the front sides of each chip, or the front side of one chip may be directly connected to the backside of the second, which may employ through chip interconnects. Although circuit elements may be fabricated on the back side, when reference is made to certain circuit elements residing within or formed in a substrate, this is generally accepted to mean the circuits reside on the front side of the substrate.

Figure 1:
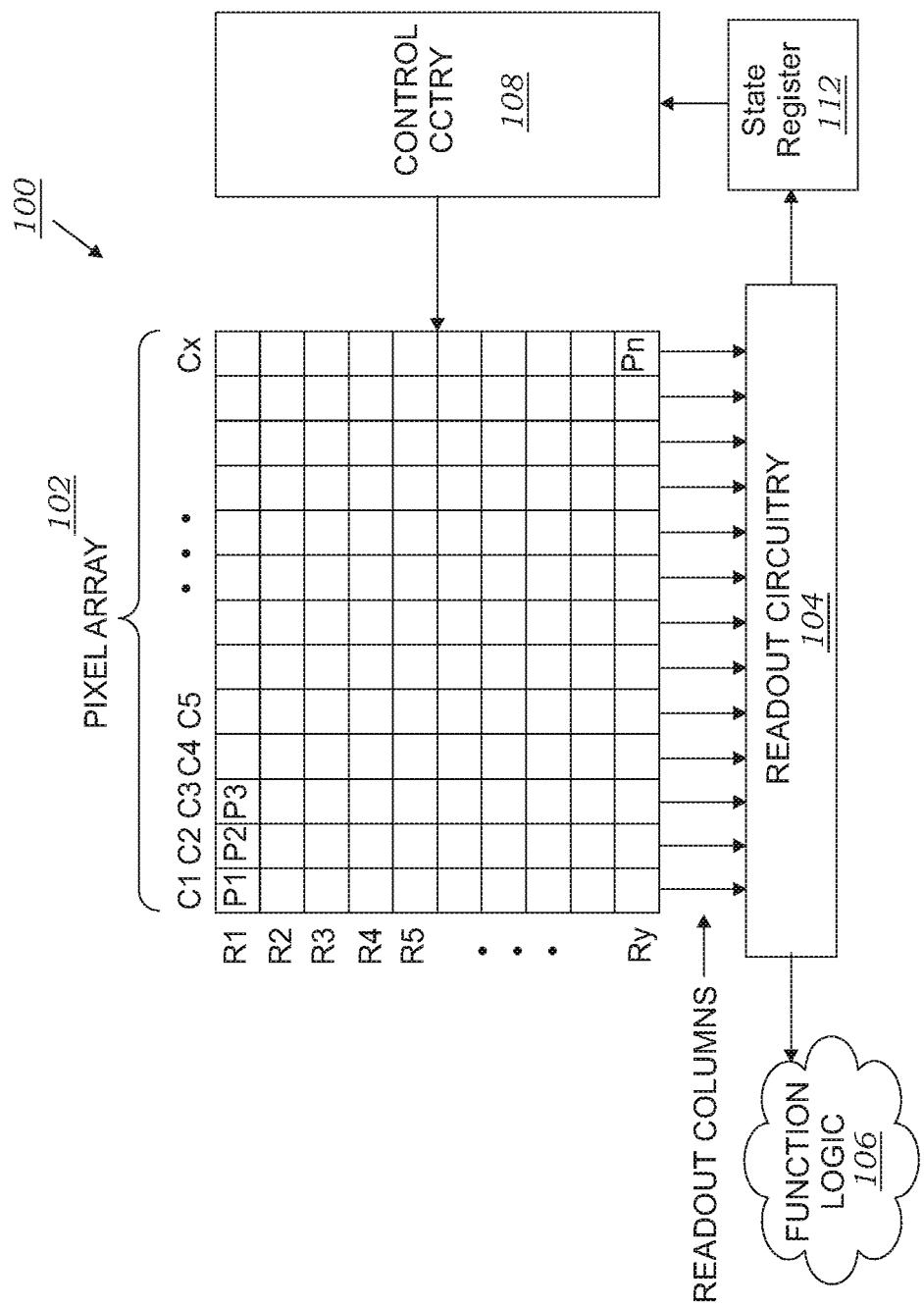
FIG. 1 is a diagram illustrating an imaging system including a pixel cell array having image sensor pixel cells included in an integrated circuit system, according to one embodiment of the present invention.

FIG. 1 is a diagram illustrating a first embodiment of an imaging system 100 including an example pixel array 102 having a plurality of image sensor pixels included in an example integrated circuit system with features in accordance with the teachings of the present invention. As shown in the depicted example, imaging system 100 includes pixel array 102 coupled to control circuitry 108 and readout circuitry 104, which is coupled to function logic 106. Control circuitry 108 and readout circuitry 104 are in addition coupled to state register 112. In one example, pixel array 102 is a two-dimensional (2D) array of image sensor pixels (e.g., pixels P1, P2 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc. In one example, after each pixel has acquired its image data or image charge, the image data is readout by readout circuitry 104 using a readout mode specified by state register 112 and then transferred to function logic 106. In various examples, readout circuitry 104 may include amplification circuitry, analog-to-digital (ADC) conversion circuitry, or otherwise. State register 112 may include a digitally programmed selection system to determine whether readout mode is by rolling shutter or global shutter. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated), or may readout the image data using a variety of other techniques (not illustrated), such as a serial readout or a full parallel readout of all pixels simultaneously. In one example, control circuitry 108 is coupled to pixel array 102 to control operational characteristics of pixel array 102. Some aspects of the operation of control circuitry 108 may be determined by settings present in state register 112. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
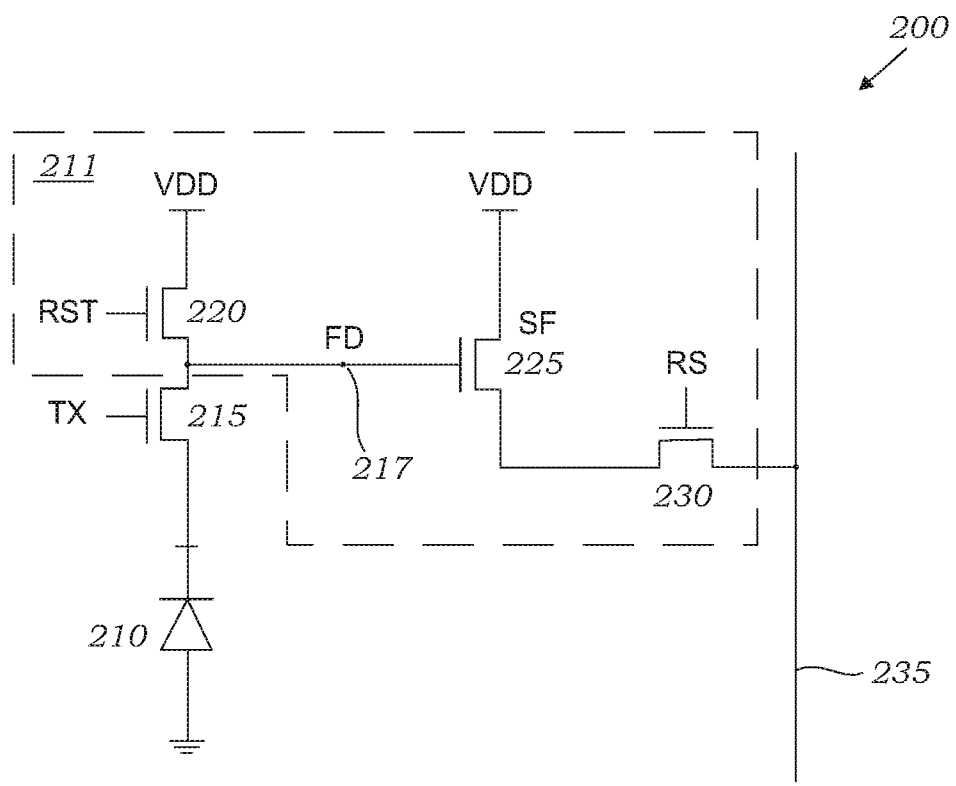
FIG. 2 is an electrical schematic that illustrates a prior art image sensor pixel cell with rolling shutter readout.

FIG. 2 is an electrical schematic that illustrates one example of an image sensor pixel cell 200 with rolling shutter readout found in the prior art. This figure and example pixel are provided to simplify explanation of pixel operation in anticipation of a description of an example of the present invention. Sensor pixel 200 comprises a 4 T pixel and each sensor pixel 200 includes a photodiode 210 (e.g., photosensitive element) and pixel support circuitry 211 as shown. Photodiode 210 may be a "pinned" photodiode as is commonly present in CMOS image sensors. Photodiode 210 may be disposed on a sensor chip of a stacked die system, while pixel support circuitry 211 may be disposed on a separate circuit chip.

In the example of FIG. 2, pixel support circuitry 211 includes a reset transistor 220, source follower (SF) amplifier transistor 225, and row select transistor 230 on a circuit chip coupled to a transfer transistor 215 and photodiode 210 on a sensor chip of a stacked die system as shown. An amplifier transistor in a source follower configuration is one in which the signal is input on the gate electrode and taken out on the source electrode. In another example, not shown, pixel support circuitry 211 includes row select transistor 230 on a circuit chip coupled to a reset transistor 220, source follower (SF) transistor 225, transfer transistor 215, and photodiode 210 on a sensor chip of a stacked die system.

During operation, photosensitive element 210 photo-generates charge in response to incident light during an exposure period. Transfer transistor 215 is coupled to receive a transfer signal TX, which causes transfer transistor 215 to transfer the charge accumulated in photodiode 210 to floating diffusion (FD) node 217. Floating diffusion 217 is in effect the drain of the transfer transistor 215 while the photodiode 210 is the source of transfer transistor 215. In one embodiment, transfer transistor 215 is a metal-oxide semiconductor field-effect transistor (MOSFET). Reset transistor 220 is coupled between power rail VDD and floating diffusion node 217 to reset sensor pixel 200 (e.g., discharge or charge floating diffusion node 217 and photodiode 210 to a preset voltage) in response to a reset signal RST. Floating diffusion node 217 is coupled to control the gate terminal of source-follower transistor 225. Source-follower transistor 225 is coupled between power rail VDD and row select transistor 230 to amplify a signal responsive to the charge on the floating diffusion FD node 217. Row select transistor 230 couples the output of pixel circuitry from the source-follower transistor 225 to the readout column, or bit line 235, in response to a row select signal RS. Photodiode 210 and floating diffusion node 217 are reset by temporarily asserting or enabling the reset signal RST and transfer signal TX. The accumulation period or accumulating window (i.e., exposure period) begins when the transfer signal TX is disabled, which permits incident light to photo-generate charge in photodiode 210. As photo-generated electrons accumulate in photodiode 210, its voltage decreases (electrons are negative charge carriers). The voltage or charge on photodiode 210 is representative of the intensity of the light incident on photodiode 210 during the exposure period. At the end of the exposure period, the reset signal RST is disabled, which turns off the reset transistor 220 and isolates floating diffusion FD node 217 from VDD. The transfer signal TX is then enabled to couple photodiode 210 to floating diffusion node 217. The charge is transferred from photodiode 210 to the floating diffusion FD node 217 through transfer transistor 215 which causes the voltage of floating diffusion FD node 217 to drop by an amount proportional to photo-generated electrons accumulated on photodiode 210 during the exposure period. The accumulation period or exposure window actually ends when the transfer transistor 215 is disabled, since the photodiode 210 is still accumulating charge while the transfer transistor 215 is enabled and transferring charge to the floating diffusion 217.

Figure 3:
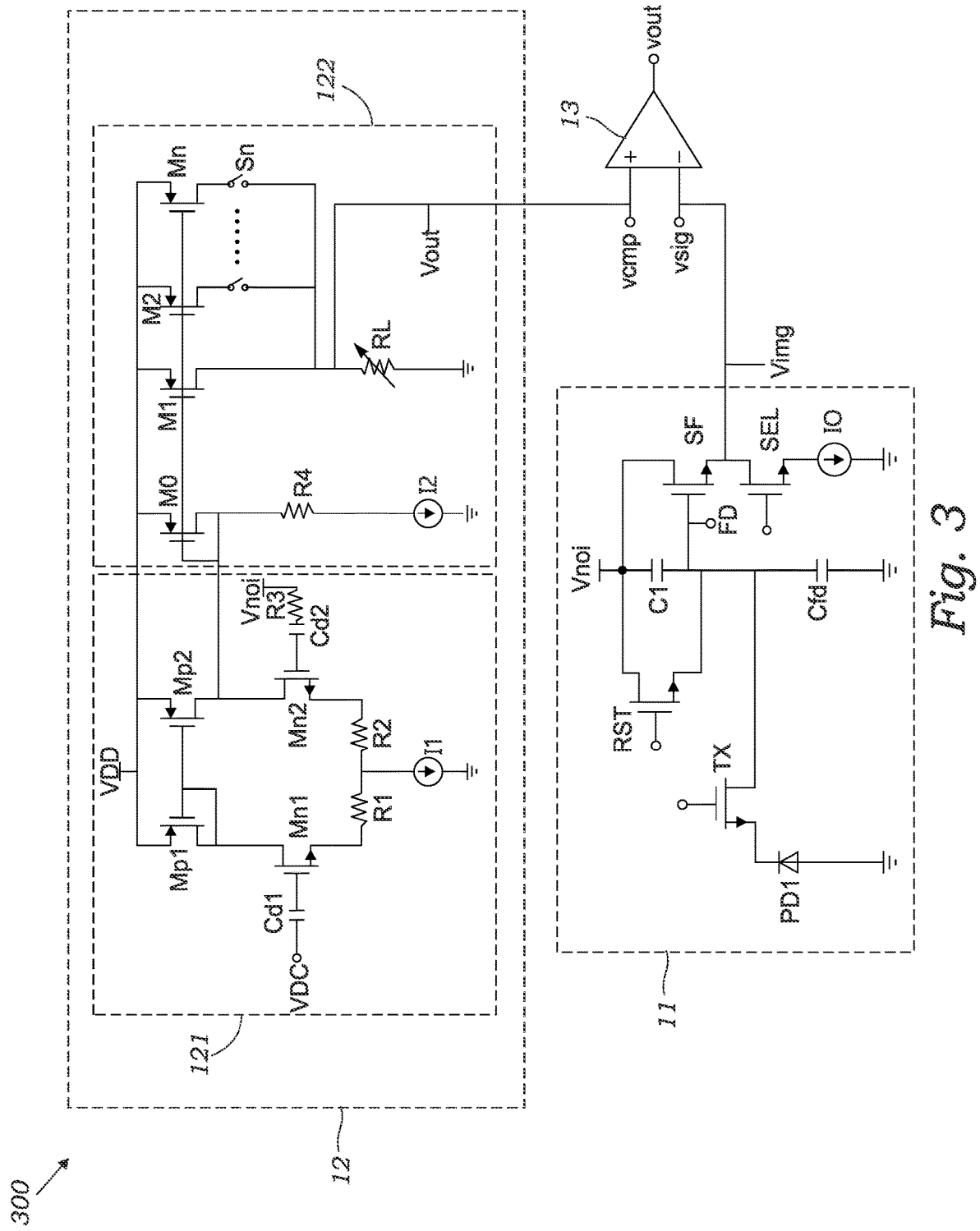
FIG. 3 is an electrical schematic diagram of a specific structure of an image sensor noise suppression circuit according to embodiments of the present invention.

FIG. 3 shows an electrical schematic diagram of a specific structure of an image sensor noise suppression circuit 300 according to embodiments of the present invention. As shown in FIG. 3, the image sensor noise suppression circuit includes a pixel circuit 11, a mirror image power supply noise circuit 12, and a comparator 13. The image signal Vimg of the pixel circuit 11, superimposed with the first power supply noise signal of power supply Vnoi, is input to a first input terminal Vsig of comparator 13. To a second input terminal Vcmp of comparator 13 is input the comparison signal Vout which is derived from the power supply noise signal of power supply Vnoi superimposed in the mirror power supply noise circuit 12. The power supply noise signal from circuit 12 has the same amplitude as the first power supply noise signal from circuit 11. In order to cancel the noise in the pixel circuit the mirror power noise circuit 12 includes a mirror circuit 121 and a gain amplifier circuit 122. The mirror circuit 121 is used to convert the noise voltage of the power supply into a compensation current, and the gain amplifier circuit 122 is used to convert the current into a voltage, and gain amplification is performed to output the second power supply noise signal to the second input terminal of comparator 13.

The pixel circuit may be a 3 T, 4 T, 5 T, or other structure. Regardless of the structure, the power supply in the pixel circuit will generate power noise, which affects the signal-to-noise ratio of the image. Specifically, a pixel circuit with a 4 T structure is taken as an example for illustration of the invention as shown in FIG. 3. As shown in FIG. 3, the pixel circuit 11 includes a photodiode PD1, a transfer transistor TX, a reset transistor RST, a source follower transistor SF, and a row selection transistor SEL. Photodiode PD1 is connected to the source of transfer transistor TX, and is reset by RST. The drain of source follower transistor SF is commonly connected to a power supply Vnoi, the drain of transfer transistor TX, the source of reset transistor RST, and the gate of source follower transistor SF are connected to floating diffusion node FD. The source of transistor SF is connected to the drain of the row selection transistor SEL, and the source of row selection transistor SEL is grounded through a current source $I_0$.

The pixel unit also includes a capacitor C1 connected between power supply Vnoi and floating diffusion node FD. A parasitic capacitor Cfd is shown to be connected between floating diffusion node FD and ground, wherein the parasitic capacitance Cfd includes all the parasitic capacitance on the floating diffusion node FD less the capacitance C1.

The capacitor C1 couples the power supply noise of the power supply Vnoi to the floating diffusion node FD, and outputs it to the first input terminal of the comparator 13 through the source follower transistor SF. Therefore, the first power supply noise signal of the power supply Vnoi in the pixel circuit is superimposed into the image signal and input to the first input terminal of the comparator 13. Then the power supply noise signal of the power supply Vnoi in the mirror power supply noise circuit 12 is superimposed into the comparison signal and input to the second input terminal of comparator 13, that is, the output terminal of the mirror power supply noise circuit 12 is connected to the node of the ramp signal Vcmp at the second input terminal of comparator 13. By making the gain of the comparison signal superimposed with the second power supply noise signal at the node Vcmp equal to the gain of the image signal superimposed with the first power supply noise signal at the node Vsig, the noise signals cancel each other, thereby eliminating the power supply noise contribution in the pixel image signal.

It is worth mentioning that the gain of the comparison signal superimposed with the second power supply noise signal at the node Vcmp is equal to the case where the gain of the image signal superimposed with the first power supply noise signal at the node Vsig in the optimal situation. In one embodiment, the first input terminal of the comparator 13 is an inverting input terminal, and the second input terminal of the comparator 13 is a non-inverting input terminal.

A more detailed description of mirror circuit 121 and gain amplifier circuit 122 employed in an embodiment of the invention shown in FIG. 3 follows. As shown in FIG. 3, the mirror circuit 121 includes a first PMOS transistor Mp1, a second PMOS transistor Mp2, a first NMOS transistor Mn1 and a second NMOS transistor Mn2. The source of the first PMOS transistor Mp1 and the source of the second PMOS transistor Mp2 are commonly connected to the first power supply voltage VDD. The gate of the first PMOS transistor Mp1 is connected to the gate of the second PMOS transistor Mp2. The gate of the first PMOS transistor Mp1 is connected to the drain of the first PMOS transistor Mp1 which is connected to the drain of the first NMOS transistor Mn1. The drain of the second PMOS transistor Mp2 is connected to the drain of the second NMOS transistor Mn2 which is connected to the output terminal of the mirror circuit. The gate of the first NMOS transistor Mn1 is connected to a first input terminal where DC voltage VDC is applied to the mirror circuit through a first capacitor Cd1, and the gate of the second NMOS transistor Mn2 is connected through a second capacitor Cd2 which is connected to a second input terminal of the mirror circuit and the power supply Vnoi. The source of first NMOS transistor Mn1 is grounded through a first resistor R1 and a current source $I_1$, and the source of second NMOS transistor Mn2 is grounded through a second resistor R2 and current source $I_1$. Therefore the mirror circuit 121 provides a current that is changed by the noise voltage of the power supply Vnoi creating a variable related to power supply noise.

In another embodiment of the invention the mirror circuit 121 further includes a third resistor R3 such that the gate of second NMOS transistor Mn2 is connected to the input terminal of the mirror circuit through second capacitor Cd2 and third resistor R3.

As shown in FIG. 3, in the first embodiment of the invention, gain amplifier circuit 122 includes a third PMOS transistor M0, a fourth PMOS transistor M1, and an adjustable resistor RL. The sources of PMOS transistors M0, M1 and M2 are commonly connected to a second power supply voltage VDD. The gate and drain of third PMOS transistor M0 and the gate of fourth PMOS transistor M1 are connected to the output terminal Vout of mirror circuit 121. The drain of PMOS transistor M0 is also connected to a second current source 12 which provides a bias current for third PMOS transistor M0. The drain of fourth PMOS transistor M1 is connected to a first terminal of an adjustable resistor RL as well as the second terminal Vcmp of comparator 13. The second end of adjustable resistor RL is grounded.

In summary, in gain amplifier circuit 122 third PMOS transistor M0 converts the current output by mirror circuit 121 into a voltage and then fourth PMOS transistor M1 converts the voltage into a current amplification and adjustable resistor RL converts the current into a voltage again which is output to the second input terminal of comparator 13.

In another embodiment of the invention, gain amplifier circuit 122 further includes a fourth resistor R4 and the drain of third PMOS transistor M0 is connected to second current source 12 through fourth resistor R4.

In another embodiment of the invention, gain amplifier circuit 122 further includes a plurality of PMOS transistors Mn and a plurality of switches Sn. The source of each PMOS transistor Mn is commonly connected to the second power supply voltage VDD and the gate of each PMOS transistor Mn is connected to the output terminal of the mirror circuit 121. The drain of each PMOS transistor Mn is connected to the drain of fourth PMOS transistor M1 through a related switch Sn. Specifically in this embodiment third PMOS transistor M0 converts the compensation current output by mirror circuit 121 into a voltage, and then fourth PMOS transistor M1 and multiple PMOS transistors M2-Mn convert the voltage into a current which is amplified and then adjustable resistor RL converts the current into a voltage again to output to the second input terminal Vcmp of comparator 13. Each of PMOS transistors M2-Mn is selected and connected into the circuit by a switch Sn. That is, by adjusting and setting the adjustable resistor and closing one or more of switches Sn to include PMOS transistors M1-Mn, the gain of the comparison signal superimposed with the second power supply noise signal is made the same as the image signal superimposed with the gain of the first power supply noise signal. In this embodiment the gain of the comparison signal superimposed with the second power supply noise signal is:

$$\frac{vsig}{vnoi} = \frac{C_1}{C_1 + C_{fd}} \times \frac{gm_{sf}}{gm_{sf} + gmb_{sf}}$$

The gain of the comparison signal superimposed with the first power supply noise signal is:

$$\frac{vcmp}{vnoi} = \frac{1}{Z_0} \times \frac{\sum_1^n W/L_{Mi}}{W/L_{M0}} \times Z_L$$

Wherein vcmp is the comparison signal superimposed with the second power supply noise signal, vsig is the image signal superimposed with the second power supply noise signal, vnoi is the noise voltage, C1 is the third capacitor, Cfd is the fourth capacitor, and Z0 is the resistance value of the third PMOS transistor, ZL is the resistance value of the adjustable resistor, W/LMi is the width-to-length ratio of fourth transistor M1 and the transistor (M2 to Mn) selected by the multiple switches. This minimizes the absolute value of the difference between vcmp/vnoi and vsig/vnoi for noise suppression. If the difference between the two gains is 0, it is the optimized. When the two gains are the same, the power supply noise of the power supply reaches the two comparators respectively. The input terminal that is, the image signal superimposed with the first power supply noise signal and the comparison signal superimposed with the power supply noise signal from the mirror/gain circuit are input to the two input terminals of the comparator, because their amplitudes are the same and the signs are the same. Therefore, the present invention uses the power supply noise of the power supply in the mirror power supply noise circuit to suppress the power supply noise of the source follower transistor in the pixel circuit, which can effectively resist power supply noise interference, reduce image noise and improve image quality.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top," "down," "above," "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims.

What is claimed is:

1. An image sensor pixel noise suppression circuit, comprising:
   a source follower transistor based pixel circuit providing an image related first output signal at a first output terminal, wherein the image related first output signal contains a noise signal component directly related to a first power supply of the source follower pixel circuit;
   a power supply voltage and noise mirror circuit converting a voltage of the first power supply including its noise signal component into a related compensation current at a second output terminal;
   a power supply voltage and noise gain circuit with its input connected to the second output terminal providing firstly a conversion of the compensation current into a voltage and secondly an amplification of the voltage to provide a compensation signal to a third output terminal a signal voltage which is equivalent to the supply voltage and noise of the first power supply;
   a second power supply to power the power supply voltage noise mirror and noise gain circuits; and
   a comparator circuit with one output and first and second input terminals, connected at the first input terminal to the first output terminal of the source follower pixel circuit and connected at the second input terminal to the third output terminal, wherein the output of the comparator circuit provides an image related output signal wherein the noise component of the first output signal has been suppressed.

2. The image sensor pixel noise suppression circuit of claim 1, wherein the power supply voltage and noise mirror circuit comprise:
   a first PMOS transistor, a second PMOS transistor, a first NMOS transistor, and a second NMOS transistor, connected as follows:
   a source of the first PMOS transistor and a source of the second PMOS transistor are commonly connected to the second power supply voltage;
   a gate of the first PMOS transistor is connected to a gate of the second PMOS transistor;
   a gate and a drain of the first PMOS transistor are connected;
   the drain of the first PMOS transistor is connected to a drain of the first NMOS transistor;
   a drain of the second PMOS transistor is connected to a drain of the second NMOS transistor and the second output terminal;
   a gate of the first NMOS transistor is connected to a DC bias terminal of the mirror circuit through a first capacitor;
   a gate of the second NMOS transistor is connected to the first power supply of the pixel source follower circuit through a second capacitor;
   a source of the first NMOS transistor is grounded through a first resistor and a first current source;
   a source of the second NMOS transistor is grounded through a second resistor and the first current source; and
   the DC bias terminal of the mirror circuit is connected to a DC voltage.

3. The image sensor pixel noise suppression circuit of claim 2, wherein the power supply voltage and noise mirror circuit further comprises a third resistor wherein the gate of the second NMOS transistor is connected to the first power supply of the pixel source follower circuit through a series connection of the second capacitor.

4. The image sensor pixel noise suppression circuit of claim 1, wherein the first input terminal of the comparator is an inverting input terminal and the second input terminal is a non-inverting input terminal.

5. The image sensor pixel noise suppression circuit of claim 1, wherein the power supply voltage and noise gain circuit comprises a third PMOS transistor, a fourth PMOS transistor, and an adjustable resistor, connected as follows:
   sources of the third and fourth PMOS transistors are commonly connected to the second power supply voltage;
   a gate and a drain of the third PMOS transistor and a gate of the fourth PMOS transistor are connected to the second output terminal of the power supply voltage and noise mirror circuit;
   a drain of the third PMOS transistor is grounded through a second current source;
   a drain of the fourth PMOS transistor is grounded through an adjustable resistor; and
   the drain of the fourth PMOS transistor is also connected to the third output terminal.

6. The image sensor pixel noise suppression circuit of claim 5, wherein the power supply voltage and noise gain amplifier circuit further comprises a plurality of PMOS transistors and a plurality of switches, connected as follows:
   the source of each of the plurality of PMOS transistors is connected to the second power supply;
   the gate of each of the plurality of PMOS transistors is connected the third output terminal; and
   the drain of each of the plurality of PMOS transistors is connected to the drain of the fourth PMOS transistor through one of the plurality of switches.

7. The image sensor pixel noise suppression circuit of claim 6, further comprising a third and a fourth capacitor wherein the third capacitor is connected between the first power supply a floating diffusion node of the pixel and is the parasitic capacitance coupling the first power supply noise to the floating diffusion and wherein the fourth capacitor is the parasitic capacitance on the diffusion node less the third capacitance.

8. The image sensor pixel noise suppression circuit of claim 7, wherein by adjusting the resistance of the adjustable resistor and closing one or more of the plurality of switches to determine the effective width to length ratio of the fourth PMOS transistor the absolute value of the difference between the signals on both terminals of the comparator circuit is minimized suppressing the noise component of the imaging signal of the pixel circuit.

9. The image sensor pixel noise suppression circuit of claim 5, wherein the power supply voltage and noise gain amplifier circuit further comprises a fourth resistor wherein the drain of the third PMOS transistor is grounded through the fourth resistor transistor through the second current source.

10. An image sensor comprising the image sensor pixel noise suppression circuit claimed in claim 1.

11. An image sensor noise suppression method comprising the steps of:
   providing an image related first output signal from a source follower transistor based pixel circuit supplied by a pixel power supply containing a noise component to a first input terminal of a two input comparator circuit;
   converting in a noise mirror circuit the power supply voltage and noise component of the power supply of the pixel circuit into a related compensation current and providing it to a second output terminal;
   converting the compensation current at the second output terminal into a voltage and amplifying it in a noise conversion and gain circuit and providing the resulting output signal to the second input terminal of the comparator circuit, wherein the noise conversion and gain circuit comprises a plurality of PMOS transistors and a plurality of switches and an adjustable resistor; and
   adjusting the adjustable resistor and closing an appropriate number of the switches in order to cause the signal at the output of the comparator circuit to suppress the pixel power supply noise component of the signal applied to the first input terminal of the comparator circuit.

* * * * *